(12) United States Patent
Yang et al.

(10) Patent No.: US 12,063,793 B2
(45) Date of Patent: Aug. 13, 2024

(54) CHALCOGEN COMPOUND AND SEMICONDUCTOR DEVICE INCLUDING THE SAME

(71) Applicant: Samsung Electronics Co., Ltd., Suwon-si (KR)

(72) Inventors: Kiyeon Yang, Seoul (KR); Bonwon Koo, Suwon-si (KR); Segab Kwon, Seoul (KR); Chungman Kim, Suwon-si (KR); Yongyoung Park, Hwaseong-si (KR); Dongho Ahn, Hwaseong-si (KR); Seunggeun Yu, Seoul (KR); Changseung Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 421 days.

(21) Appl. No.: 17/362,075

(22) Filed: Jun. 29, 2021

(65) Prior Publication Data

US 2022/0149114 A1 May 12, 2022

(30) Foreign Application Priority Data

Nov. 10, 2020 (KR) ........................ 10-2020-0149586

(51) Int. Cl.
*H10B 63/00* (2023.01)
*H01L 29/24* (2006.01)
*H10N 70/00* (2023.01)
*H10N 70/20* (2023.01)

(52) U.S. Cl.
CPC ............. *H10B 63/24* (2023.02); *H01L 29/24* (2013.01); *H10N 70/245* (2023.02); *H10N 70/826* (2023.02); *H10N 70/8833* (2023.02)

(58) Field of Classification Search
CPC ...................................................... H10B 63/00
See application file for complete search history.

(56) References Cited

U.S. PATENT DOCUMENTS

| | | |
|---|---|---|
| 7,638,789 B2 | 12/2009 | Peters |
| 7,864,567 B2 | 1/2011 | Gordon et al. |
| 9,704,921 B2 | 7/2017 | Kim et al. |
| (Continued) | | |

FOREIGN PATENT DOCUMENTS

| | | |
|---|---|---|
| CN | 110760805 A | 2/2020 |
| WO | WO-2019/167538 A1 | 9/2019 |

OTHER PUBLICATIONS

Extended European Search Report dated Mar. 14, 2022, issued in corresponding European Patent Application No. 21189050.4.

*Primary Examiner* — Marvin Payen
(74) *Attorney, Agent, or Firm* — HARNESS, DICKEY & PIERCE, P.L.C.

(57) ABSTRACT

Provided are a chalcogen compound having ovonic threshold switching characteristics, and a switching device, a semiconductor device, and/or a semiconductor apparatus which include the chalcogen compound. The chalcogen compound includes five or more elements and may have stable switching characteristics with a low off-current value (leakage current value). The chalcogen compound includes: selenium (Se) and tellurium (Te); a first element comprising at least one of indium (In), aluminum (Al), strontium (Sr), and calcium (Ca); and a second element including germanium (Ge) and/or tin (Sn), and may further include at least one of arsenic (As), antimony (Sb), and bismuth (Bi).

46 Claims, 13 Drawing Sheets

(56) References Cited

U.S. PATENT DOCUMENTS

| | | |
|---|---|---|
| 9,748,311 B2 | 8/2017 | Fantini et al. |
| 10,062,840 B2 | 8/2018 | Sim et al. |
| 10,084,017 B2 | 9/2018 | Ohba et al. |
| 10,163,977 B1 | 12/2018 | Fantini et al. |
| 10,186,552 B2 | 1/2019 | Choi et al. |
| 10,374,009 B1 | 8/2019 | Cheng et al. |
| 10,403,681 B2 | 9/2019 | Ahn et al. |
| 2010/0163822 A1 | 7/2010 | Ovshinsky et al. |
| 2012/0002461 A1 | 1/2012 | Karpov et al. |
| 2017/0237000 A1 | 8/2017 | Terai et al. |
| 2017/0244031 A1 | 8/2017 | Jeong et al. |
| 2018/0005703 A1 | 1/2018 | Chung |
| 2018/0277601 A1 | 9/2018 | Ahn et al. |
| 2019/0115393 A1 | 4/2019 | Cheng et al. |
| 2019/0148456 A1 | 5/2019 | Wu et al. |
| 2019/0189920 A1 | 6/2019 | Horii et al. |
| 2020/0075853 A1 | 3/2020 | Yu et al. |
| 2020/0365801 A1* | 11/2020 | Yu ........................ H10N 70/026 |
| 2020/0411759 A1 | 12/2020 | Sei et al. |
| 2022/0173316 A1* | 6/2022 | Yang ..................... H10B 63/24 |

\* cited by examiner

CHALCOGEN COMPOUND AND SEMICONDUCTOR DEVICE INCLUDING THE SAME

CROSS-REFERENCE TO RELATED APPLICATION

This application is based on and claims priority under 35 U.S.C. § 119 to Korean Patent Application No. 10-2020-0149586, filed on Nov. 10, 2020, in the Korean Intellectual Property Office, the disclosure of which is incorporated by reference herein in its entirety.

BACKGROUND

1. Field

The present disclosure relates to a chalcogen compound and/or a semiconductor device including the chalcogen compound.

2. Description of Related Art

There is increasing demand for highly integrated semiconductor devices along with a trend toward light, thin, simple, and small electronic products. Therefore, various types of semiconductor devices, such as a semiconductor device including a variable resistance layer and a selection device layer, have been proposed.

SUMMARY

Provided are chalcogen compounds having ovonic threshold switching characteristics.

Provided are switching devices, semiconductor devices, and/or semiconductor apparatuses having low off-current and high reliability (endurance).

Additional aspects will be set forth in part in the description which follows and, in part, will be apparent from the description, or may be learned by practice of the presented embodiments of the disclosure.

According to an embodiment, a semiconductor device may include a selection layer including a chalcogen compound. The chalcogen compound may include a first element, a second element, a third element, selenium (Se), and tellurium (Te). The first element may include at least one of indium (In), aluminum (Al), strontium (Sr), and calcium (Ca). The second element may include germanium (Ge) and/or tin (Sn).

The third element may include at least one of arsenic (As), antimony (Sb), and bismuth (Bi).

In some embodiments, an element ratio of tellurium (Te) to selenium (Se) in the chalcogen compound may be greater than 0.0 but less than or equal to 0.5. The element ratio of tellurium (Te) to selenium (Se) may be greater than 0.0 and less than or equal to 0.3. The element ratio of tellurium (Te) to selenium (Se) in the chalcogen compound may be greater than 0.0 but less than or equal to 0.2. The element ratio of tellurium (Te) to selenium (Se) in the chalcogen compound may range from 0.07 to 0.20.

In some embodiments, in the chalcogen compound, tellurium (Te) may be included in an amount of 0.5 at % to 20.0 at % based on a total element amount. Tellurium (Te) may be included in an amount of 2.0 at % to 15.0 at %, based on a total element amount.

In some embodiments, in the chalcogen compound, tellurium (Te) may be included in an amount of 3.0 at % to 9.0 at %, based on a total element amount, and the element ratio of Te/Se may be greater than or equal to about 0.06 and less than or equal to about 0.19.

In some embodiments, in the chalcogen compound, selenium (Se) may be included in an amount greater than 0.0 at % and equal to or less than 70.0 at % based on a total element amount. Selenium (Se) may be included in an amount of 20.0 at % to 70.0 at %, based on a total element amount.

In some embodiments, the chalcogen compound may include the first element in in an amount of 0.1 at % to 10.0 at % based on a total element amount. The chalcogen compound may include the second element in an amount of 5.0 at % to 30.0 at % based on a total element amount. The chalcogen compound may include the third element in an amount of 20.0 at % to 50.0 at % based on a total element amount.

In some embodiments, the chalcogen compound may be represented by any one of Chemical Expressions 1, 2, or 3 below.

  [Chemical Expression 1]

wherein, in Chemical Expression 1, A refers to the first element, B refers to the second element, C refers to the third element, and $0.01 \le a1 \le 0.10$, $0.05 \le b1 \le 0.30$, $0.05 \le c1 \le 0.50$, $0.20 \le d1 \le 0.70$, and $0.0 < e1 \le 0.1$.

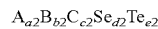  [Chemical Expression 2]

wherein, in Chemical Expression 2, A refers to the first element, B refers to the second element, C refers to the third element, and $0.01 \le a2 \le 0.10$, $0.05 \le b2 \le 0.30$, $0.05 \le c2 \le 0.50$, $0.20 \le d2 \le 0.70$, and $0.05 \le e2 \le 0.2$.

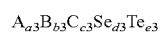  [Chemical Expression 3]

wherein, in Chemical Expression 3, A refers to the first element, B refers to the second element, C refers to the third element, and $0.001 \le a3 \le 0.10$, $0.05 \le b3 \le 0.30$, $0.20 \le c3 \le 0.50$, $0.20 \le d3 \le 0.70$, and $0 < e3 \le 0.2$.

In some embodiments, the chalcogen compound may further include at least one of carbon (C), nitrogen (N), and oxygen (O).

In some embodiments, the chalcogen compound may have a crystallization temperature of 350° C. to 600° C.

In some embodiments, the chalcogen compound may have a sublimation temperature of 250° C. to 400° C.

In some embodiments, the semiconductor device may further include a variable resistance layer and the selection layer may be electrically connected to the variable resistance layer. The semiconductor device may further include a first electrode layer, a second electrode layer, and a third electrode layer, where the selection layer may be arranged between the first electrode layer and the second electrode layer, and the variable resistance layer may be arranged between the second electrode layer and the third electrode layer.

In some embodiments, each of the first electrode layer, the second electrode layer, and the third electrode layer independently may comprises at least one of carbon (C), titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN).

In some embodiments, the variable resistive layer may include a material capable of reversibly changing between crystalline and amorphous phases according to temperature variations.

In some embodiments, the variable resistance layer may include a compound containing at least one of Te and Se and further contain at least one of Ge, Sb, Bi, Pb, Sn, Ag, As, S, Si, In, Ti, Ga, P, B, O, and C.

In some embodiments, the variable resistance layer may further include at least one of aluminum (Al), zinc (Zn), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), and polonium (Po).

In some embodiments, the semiconductor device may include a heating electrode in contact with the variable resistance layer.

In some embodiments, the variable resistance layer may include a material in which electrical resistance may be reversibly variable according to an external voltage applied thereto.

In some embodiments, the variable resistance layer may include an oxide of at least one of Ta, Zr, Ti, Hf, Mn, Y, Ni, Co, Zn, Nb, Cu, Fe, and Cr.

In some embodiments, the variable resistance layer may include a material in which polarization is reversibly changeable according to an external voltage applied thereto.

In some embodiments, the variable resistance layer may include at least one perovskite compound including one of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, and barium-strontium-zirconium oxide.

In some embodiments, the variable resistance layer may include a material in which magnetization is reversibly variable according to an external voltage applied thereto.

In some embodiments, the variable resistance layer may include two electrodes comprising a magnetic material; and a dielectric arranged between the two electrodes.

In some embodiments, the selection layer may have a threshold voltage of 2.5 V to 5.0 V.

In some embodiments, the selection layer may be capable of repeatedly performing an on-off operation 5×10$^7$ times or more by using a pulse having a rise/fall time of 10 ns and a width of 100 ns. The selection device layer may have ovonic switching characteristics. The selection device layer may have low current leakage and high endurance. In some embodiments, the selection layer a threshold voltage variation $V_{th\_drift}$ of 50 mV/dec or less.

In some embodiments, a semiconductor apparatus may include a substrate; a plurality of first electrode lines on the substrate, the plurality of first electrode lines extending parallel to a top surface of the substrate and extending in a first direction; a plurality of second electrode lines above the plurality of first electrode lines and parallel to the top surface of the substrate, the plurality of second electrode lines extending in a second direction different from the first direction; and a first semiconductor device including the semiconductor device above, wherein the first semiconductor device may be arranged at a cross point between the plurality of first electrode lines and the plurality of second electrode lines.

In some embodiments, the semiconductor apparatus may further include a plurality of third electrode lines above the plurality of first electrode lines and the plurality of second electrode lines; and a second semiconductor device like the first semiconductor device. The second semiconductor device may be arranged at a cross point between the plurality of second electrode lines and the plurality of third electrode lines. The plurality of third electrode lines may extend in the first direction.

In some embodiments, the semiconductor apparatus may further include a circuit unit configured to drive the first semiconductor device and the second semiconductor device or perform arithmetic processing.

In an example embodiment, a semiconductor apparatus may include a memory cell including a chalcogen compound. The chalcogen compound may include a first element, a second element, a third element, selenium (Se), and tellurium (Te). The first element may include at least one of indium (In), aluminum (Al), strontium (Sr), and calcium (Ca). The second element may include at least one of germanium (Ge) and tin (Sn). The third element may include at least one of arsenic (As), antimony (Sb), and bismuth (Bi).

In some embodiments, in the chalcogen compound, tellurium (Te) may be included in an amount of about 3 at % to 9 at % based on a total element amount, and the element ratio of tellurium (Te) to selenium (Se) may be greater than or equal to about 0.06 and less than or equal to about 0.19.

In some embodiments, the chalcogen compound may be represented by any one of Chemical Expressions 1, 2, or 3 below.

  [Chemical Expression 1]

$$A_{a1}B_{b1}C_{c1}Se_{d1}Te_{e1}$$

wherein, in Chemical Expression 1, A refers to the first element, B refers to the second element, C refers to the third element, and $0.01 \leq a1 \leq 0.10$, $0.05 \leq b1 \leq 0.30$, $0.05 \leq c1 \leq 0.50$, $0.20 \leq d1 \leq 0.70$, and $0.0 < e1 \leq 0.1$.

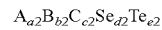  [Chemical Expression 2]

$$A_{a2}B_{b2}C_{c2}Se_{d2}Te_{e2}$$

wherein, in Chemical Expression 2, A refers to the first element, B refers to the second element, C refers to the third element, and $0.01 \leq a2 \leq 0.10$, $0.05 \leq b2 \leq 0.30$, $0.05 \leq c2 \leq 0.50$, $0.20 \leq d2 \leq 0.70$, and $0.05 \leq e2 \leq 0.2$.

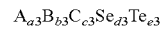  [Chemical Expression 3]

$$A_{a3}B_{b3}C_{c3}Se_{d3}Te_{e3}$$

wherein, in Chemical Expression 3, A refers to the first element, B refers to the second element, C refers to the third element, and $0.001 \leq a3 \leq 0.10$, $0.05 \leq b3 \leq 0.30$, $0.20 \leq c3 \leq 0.50$, $0.20 \leq d3 \leq 0.70$, and $0 < e3 \leq 0.2$.

In some embodiments, the memory cell may include a variable resistance layer.

In some embodiments, in the chalcogen compound, the first element may be included in an amount of 0.1 at % to 10.0 at % based on a total element amount, the second element may be included in an amount of 5.0 at % to 30.0 at % based on a total element amount, and the third element may be included in an amount of 5.0 at % to 50.0 at % based on a total element amount.

In some embodiments, the chalcogen compound may further include at least one of carbon (C), nitrogen (N), and oxygen (O).

In some embodiments, the semiconductor apparatus may further include a substrate; a first electrode line on a top surface of the substrate and extending in a first direction; a second electrode line above the first electrode line and extending in a second direction different from the first direction; and a first memory cell including the memory cell, wherein the first memory cell may be arranged at a cross point between the first electrode line and the second electrode line.

In some embodiments, the semiconductor apparatus may further include a third electrode line above the first electrode line and the second electrode line, the third electrode line extending in the first direction; and a second memory cell arranged at a cross point between the second electrode line and the third electrode line.

In some embodiments, an electronic device may include the semiconductor apparatus and processing circuitry configured to drive the semiconductor apparatus.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
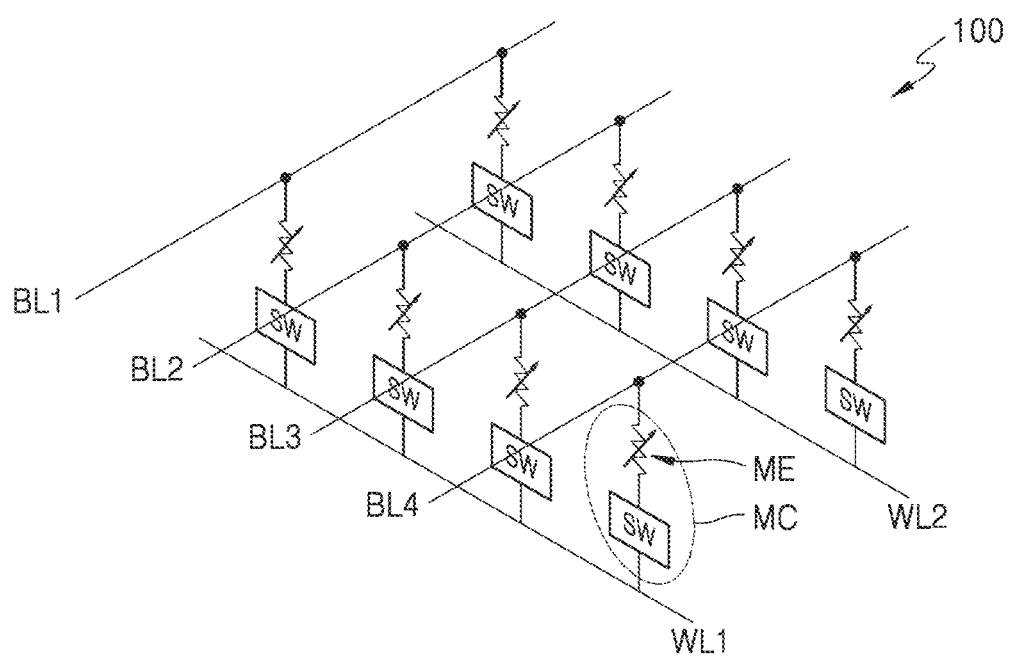
FIG. 1 is an equivalent circuit diagram illustrating a semiconductor apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

In the following description, terms are used only for explaining specific embodiments while not limiting the scope of the present disclosure. When an element is referred to as being "above" or "on" another element, it may be directly on an upper, lower, left, or right side of the other element while making contact with the other element or may be above an upper, lower, left, or right side of the other element without making contact with the other element.

The terms of a singular form may include plural forms unless otherwise mentioned. Unless otherwise mentioned, the terms "comprises" and/or "comprising" used herein specify the presence of stated features, numbers, steps, processes, elements, components, materials, or combinations thereof but do not preclude the presence or addition of one or more other features, numbers, steps, processes, elements, components, materials, or combinations thereof.

Although terms such as "first," "second," and "third" are used to describe various elements, the terms are only used to distinguish one element from other elements, and the features of the elements such as order and type should not be limited by the terms. In addition, terms such as "unit," "means," "module," or "part" may be used to denote a unit of a comprehensive structure that has at least one function or operation and is implemented with hardware, software, or a combination of hardware and software.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments will be described with reference to the accompanying drawings. In the drawings, like reference numerals refer to like elements, and the sizes of elements (such as the widths and thicknesses of layers or regions) may be exaggerated for clarity of illustration. The embodiments described herein are for illustrative purposes only, and various modifications may be made therein.

According to one aspect, a semiconductor device having high reliability (endurance) and a semiconductor apparatus including the semiconductor device are provided. For example, the semiconductor apparatus may include a plurality of semiconductor devices between two separate groups of electrode lines, and each of the semiconductor devices may include a variable resistance layer and a selection device layer which are electrically connected to each other. In addition, the semiconductor apparatus may have a three-dimensional structure in which the two groups of electrode lines have cross points. The semiconductor devices and/or the semiconductor apparatus may be memory devices.

FIG. 1 is an equivalent circuit diagram illustrating a semiconductor apparatus 100 according to an embodiment. Referring to FIG. 1, the semiconductor apparatus 100 may include a plurality of first electrode lines WL1 and WL2 extending parallel to each other in a first direction (X direction). In addition, the semiconductor apparatus 100 may include second electrode lines BL1, BL2, BL3, and BL4 spaced apart from the first electrode lines WL1 and WL2 in a third direction (Z direction) and extending parallel to each other in a second direction. Semiconductor devices MC may be arranged between the first electrode lines WL1 and WL2 and the second electrode lines BL1, BL2, BL3 and BL4. For example, the semiconductor devices MC may be respectively arranged at cross points between the first electrode lines WL1 and WL2 and the second electrode lines BL1, BL2, BL3, and BL4 and may be electrically connected to the first electrode lines WL1 and WL2 and the second electrode lines BL1, BL2, BL3, and BL4. In addition, each of the semiconductor devices MC may include a variable resistance layer ME and a selection device layer SW that are electrically connected to each other. For example, the variable resistance layer ME and the selection device layer SW may be connected in series to each other in the third direction (Z direction), wherein the selection device layer SW may be electrically connected to the first electrode lines WL1 and WL2 or the second electrode lines BL1, BL2, BL3, and BL4, and the variable resistance layer ME may be electrically connected to the other electrode lines.

Briefly, the semiconductor apparatus 100 may be driven by applying a voltage to the variable resistance layer ME of the semiconductor devices MC through the first electrode lines WL1 and WL2 and the second electrode lines BL1, BL2, BL3, and BL4 in order to induce an electric current flow. For example, a certain semiconductor device MC may be addressed by selectively choosing a selected one of the first electrode lines WL1 and WL2 and a selected one of the second electrode lines BL1, BL2, BL3, and BL4, and the semiconductor device MC may be programmed by applying a signal between the chosen electrode lines of the first electrode lines WL1 and WL2 and the second electrode lines BL1, BL2, BL3, and BL4. In addition, information which depends on the resistance value of the variable resistance layer ME of the semiconductor device MC, that is, programmed information, may be read by measuring a current value through the second electrode lines BL1, BL2, BL3, BL4.

The variable resistance layer ME may have a function of storing information. For example, the resistance of the variable resistance layer ME may vary according to a voltage applied thereto. The semiconductor device MC may store and erase digital information such as "0" or "1" according to variations in the resistance of the variable resistance layer ME. The semiconductor device MC may write data, for example, a high resistance state of the variable resistance layer ME as "0" and a low resistance state of the variable resistance layer ME as "1." Here, writing from the high resistance state "0" to the low resistance state "1" may be referred to as a "set operation," and writing from the low resistance state "1" to the high resistance state "0" may be referred to as a "reset operation."

The selection device layer SW may have a function of selecting (addressing) a semiconductor device MC electrically connected to the selection device layer SW by controlling current to the semiconductor device MC. For example, the selection device layer SW may include a material in which the resistance is variable depending on the magnitude of voltage applied to both ends of the selection device layer SW. For example, the selection device layer SW may have ovonic threshold switching (OTS) characteristics.

Figure 2:
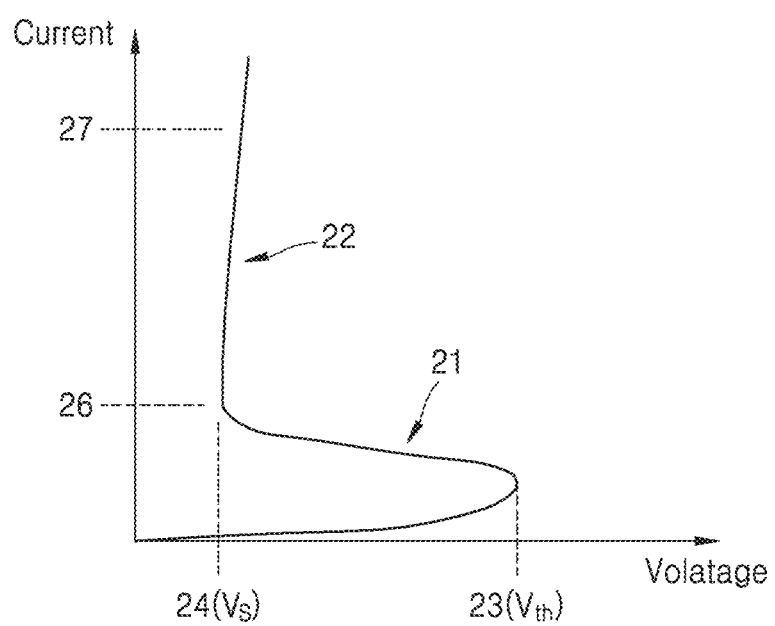
FIG. 2 is a graph schematically illustrating a voltage-current curve of a material having ovonic threshold switching characteristics.

FIG. 2 is a graph schematically illustrating a voltage-current curve of the selection device layer SW having OTS characteristics. Referring to FIG. 2, a first curve 21 shows a voltage-current relationship in a state in which little current flows through the selection device layer SW. When voltage gradually increases from a state in which voltage and current are 0, the selection device layer SW may stay in a high resistance state in which little current flows in the selection device layer SW until the voltage reaches a threshold voltage $V_{th}$ (first voltage level 23). However, as soon as the voltage exceeds the threshold voltage $V_{th}$, the selection device layer SW enters a low resistance state such that current flowing through the selection device layer SW may markedly increase, and the voltage applied to the selection device layer SW may decrease to a saturation voltage Vs (second voltage level 24). A second curve 22 shows a voltage-current relationship in a state in which current flows more smoothly through the selection device layer SW. As the current flowing through the selection device layer SW becomes greater than a first current level 26, the voltage applied to the selection device layer SW may become slightly greater than the second voltage level 24. For example, while the current flowing through the selection device layer SW markedly increases from the first current level 26 to a second current level 27, the voltage applied to the selection device layer SW may slightly increase from the second voltage level 24. In other words, once current flows through the selection device layer SW, the voltage applied to the selection device layer SW may be maintained at the saturation voltage VS. When the current decreases below a retention current level (the first current level 26), the selection device layer SW returns to the high resistance state, and thus current may be effectively blocked until the voltage increases to the threshold voltage $V_{th}$. Owing to these characteristics, the selection device layer SW may function as a switching device having a threshold voltage $V_{th}$ at the first voltage level 23.

However, even when a voltage lower than the threshold voltage $V_{th}$ is applied to the semiconductor device MC (when the semiconductor device MC is in an off state), a certain level of current may flow in the selection device layer SW as shown in FIG. 2. When off-state current (leakage current) is high, it may be difficult to operate the semiconductor apparatus 100 including a large number of semiconductor devices MC. Moreover, the reliability and endurance of the selection device layer SW may deteriorate as the threshold voltage $V_{th}$ or the ratio ($I_{on}/I_{off}$) of on-current to off-current of the selection device layer SW varies with the cumulative use time or the cumulative number of on/off operation times of the semiconductor devices MC.

According to an embodiment, the selection device layer SW may include a chalcogen compound containing five or more elements and may have stable switching characteristics while having a low off-current value (leakage current value). In an embodiment, for example, the chalcogen compound may include selenium (Se) and tellurium (Te) and may further include: one or more first elements selected from the group consisting of (or including one of) indium (In), aluminum (Al), strontium (Sr), and calcium (Ca); a second element including germanium (Ge) and/or tin (Sn); and one or more third element selected from the group consisting of (or including one of) arsenic (As), antimony (Sb), and bismuth (Bi).

A chalcogen compound composed of three elements, GeAsSe, may have OTS characteristics, but has poor applicability to semiconductor devices because of a high off-current value (leakage current value) and poor endurance. Since the chalcogen compound of the embodiment further includes the first element, the chalcogen compound of the embodiment may have a low off-current value (leakage current value), and since the chalcogen compound of the embodiment further include tellurium (Te) in addition to selenium (Se), that is, two chalcogen elements, the chalcogen compound of the embodiment may high switching endurance. Although the chalcogen compound of the embodiment is not limited to a particular theory, since the chalcogen compound of the embodiment includes tellurium (Te) and the first element at the same time, the chalcogen compound of the embodiment may have fewer carrier hopping sites than a chalcogen compound composed of three elements, GeAsSe. Owing to this, the specific resistance of the chalcogen compound of the embodiment may increase, and the off-current value (leakage current value) of the chalcogen compound of the embodiment may decrease. In addition, the chalcogen compound of the embodiment has higher density than a chalcogen compound composed of three components, GeAsSe, and thus when an external voltage is applied to the chalcogen compound of the embodiment, the movement of atoms caused by an electric field is suppressed, thereby improving the endurance of the chalcogen compound.

The element ratio of tellurium (Te) to selenium (Se) in the chalcogen compound may be greater than about 0.0 but equal to or less than about 0.5. For example, the element ratio of tellurium (Te) to selenium (Se) may be about 0.01 or more, about 0.03 or more, about 0.05 or more, about 0.07 or more, about 0.10 or more, about 0.30 or less, about 0.25 or less, about 0.20 or less, about 0.17 or less, or about 0.15 or less. When the content of selenium (Se) is excessively large, variations in threshold voltage $V_{th}$ may increase with the cumulative use time, and when the content of tellurium (Te) is excessively large, off-current (leakage current) may increase.

The amount of tellurium (Te) in the chalcogen compound may range from about 0.5 at % to about 20.0 at % based on the total amount of elements in the chalcogen compound. For example, the amount of tellurium (Te) may be about 1.0 at % or more, about 2.0 at % or more, about 3.0 at % or more, about 5.0 at % or more, about 15.0 at % or less, about 12.0 at % or less, about 10.0 at % or less, or about 7.0 at % or less, based on the total amount of elements in the chalcogen compound.

The amount of selenium (Se) in the chalcogen compound may be greater than about 0.0 at % but equal to or less than about 70.0 at % based on the total amount of elements in the chalcogen compound. For example, the amount of selenium (Se) may be about 10.0 at % or more, about 15 at % or more, about 20.0 at % or more, about 25.0 at % or more, about 30.0 at % or more, about 35.0 at % or more, about 40.0 at % or more, about 65.0 at % or less, about 60.0 at % or less, or about 55.0 at % or less, based on the total amount of elements in the chalcogen compound.

The amount of the first element in the chalcogen compound may range from about 0.1 at % to about 10.0 at % based on the total amount of elements in the chalcogen compound. For example, the amount of the first element may be about 0.5 at % or more, about 1.0 at % or more, about 1.5 at % or more, about 2.0 at % or more, about 7.0 at % or less, about 6.0 at % or less, or about 5.0 at % or less, based on the total amount of elements in the chalcogen compound.

The amount of the second element in the chalcogen compound may range from about 5.0 at % to about 30.0 at % based on the total amount of elements in the chalcogen compound. For example, the amount of the second element may be about 7.0 at % or more, about 10.0 at % or more, about 25.0 at % or less, about 23.0 at % or less, or about 20.0 at % or less, based on the total amount of elements in the chalcogen compound.

The amount of the third element in the chalcogen compound may range from about 5.0 at % to about 50.0 at % based on the total amount of elements in the chalcogen compound. For example, the amount of the third element may be about 7.0 at % or more, about 10.0 at % or more, about 15.0 at % or more, about 20.0 at % or less, about 45.0 at % or less, about 40.0 at % or less, or about 35.0 at % or less, based on the total amount of elements in the chalcogen compound.

Performance factors such as threshold voltage $V_{th}$, off-current value (leakage current value), threshold voltage variation $V_{th\_drift}$, and endurance may have a trade-off relationship according to the contents of the first element, the second element, the third element, selenium (Se), and/or tellurium (Te). For example, as the content of tellurium (Te) increases relative to the content of selenium (Se), threshold voltage variation $V_{th\_drift}$ and/or endurance may improve, but threshold voltage $V_{th}$ may decrease or off-current (leakage current) may increase. In addition, as the content of the first element decreases, threshold voltage variation $V_{th\_drift}$ may increase, and off-current (leakage current) may decrease. Therefore, the contents of the first element, the second element, the third element, selenium (Se), and tellurium (Te) may be adjusted according to an intended performance level.

For example, the chalcogen compound may include a compound represented by Chemical Expression 1, a compound represented by Chemical Expression 2, and/or a compound represented by Chemical Expression 3.

$$A_{a1}B_{b1}C_{c1}Se_{d1}Te_{e1} \qquad \text{[Chemical Expression 1]}$$

In Chemical Expression 1, A refers to the first element, B refers to the second element, C refers to the third element, and $0.01 \leq a1 \leq 0.10$, $0.05 \leq b1 \leq 0.30$, $0.05 \leq c1 \leq 0.50$, $0.20 \leq d1 \leq 0.70$, and $0.0 < e1 \leq 0.1$.

$$A_{a2}B_{b2}C_{c2}Se_{d2}Te_{e2} \qquad \text{[Chemical Expression 2]}$$

In Chemical Expression 2, A refers to the first element, B refers to the second element, C refers to the third element, and $0.01 \leq a2 \leq 0.10$, $0.05 \leq b2 \leq 0.30$, $0.05 \leq c2 \leq 0.50$, $0.20 \leq d2 \leq 0.70$, and $0.05 \leq e2 \leq 0.2$. Alternatively, in Chemical Expression 2, $0.05 \leq e2 \leq 0.15$.

$$A_{a3}B_{b3}C_{c3}Se_{d3}Te_{e3} \qquad \text{[Chemical Expression 3]}$$

In Chemical Expression 3, A refers to the first element, B refers to the second element, C refers to the third element, and $0.001 \leq a3 \leq 0.10$, $0.05 \leq b3 \leq 0.30$, $0.20 \leq c3 \leq 0.50$, $0.20 \leq d3 \leq 0.70$, and $0 < e3 \leq 0.2$. Alternatively, in Chemical Expression 3, $0.01 \leq a3 \leq 0.07$, $0.10 \leq b3 \leq 0.20$, $0.20 \leq c3 \leq 0.40$, $0.30 \leq d3 \leq 0.60$ or $0.35 \leq d3 \leq 0.55$, and $0 < e3 \leq 0.15$ or $0.05 \leq e3 \leq 0.10$.

The chalcogen compound according to the embodiment may additionally include carbon (C), nitrogen (N) and/or oxygen (O). Although the chalcogen compound is not limited to a particular theory, the additional elements may limit and/or suppress the formation and growth of nuclei in the chalcogen compound and may thus increase the thermal stability of the chalcogen compound.

The chalcogen compound of the embodiment may have high thermal stability and may thus be less damaged or deteriorated during manufacturing processes such as semiconductor device manufacturing processes. For example, the crystallization temperature of the chalcogen compound may range from about 350° C. to about 600° C. For example, the crystallization temperature of the chalcogen compound may be about 380° C. or higher, about 400° C. or higher, about 580° C. or lower, or about 550° C. or lower. In addition, the sublimation temperature of the chalcogen compound may range from about 250° C. to about 400° C. For example, the sublimation temperature of the chalcogen compound may be about 280° C. or higher, about 300° C. or higher, about 380° C. or lower, or about 350° C. or lower.

In some embodiments, the chalcogen compound may include any one of a compound represented by Chemical Expression 4, a compound represented by Chemical Expression 5, and/or a compound represented by Chemical Expression 6.

$$A'_{a4}B_{b4}C_{c4}Se_{d4}Te_{e4} \qquad \text{[Chemical Expression 4]}$$

$$A_{a5}B_{b5}C_{c5}Se_{d5}Te_{e5} \qquad \text{[Chemical Expression 5]}$$

$$In_{a6}Ge_{b6}As_{c6}Se_{d6}Te_{e6} \qquad \text{[Chemical Expression 6]}$$

In Chemical Expressions 4 to 6,

A' includes N and/or any of the first element (e.g., In, Al, Sr, or Ca);

A is the first element (e.g., In, Al, Sr, or Ca); B is the second element (e.g., at least one Ge or Sn); and C is third element (e.g., at least one of As, Sb, or Bi).

Also, in Chemical Expressions 4 to 6, $0.005 \leq a4 \leq 0.05$, $0.001 \leq a5$, $a6 \leq 0.10$, $0.10 \leq b4 \leq 0.40$, and $0.05 \leq b5$, $b6 \leq 0.30$, $0.05 \leq c4 \leq 0.50$, and $0.20 \leq c5$, $c6 \leq 0.50$, $0.30 \leq d4 \leq 0.70$, and $0.20 \leq d5$, $d6 \leq 0.70$, and $0.01 \leq e4 \leq 0.1$, and $0.03 \leq e5$, $e6 \leq 0.12$.

In Chemical Expressions 5-6, the ratio of Te/Se may be in a range of 0.05 to 0.30, but is not limited thereto.

Figure 3A:
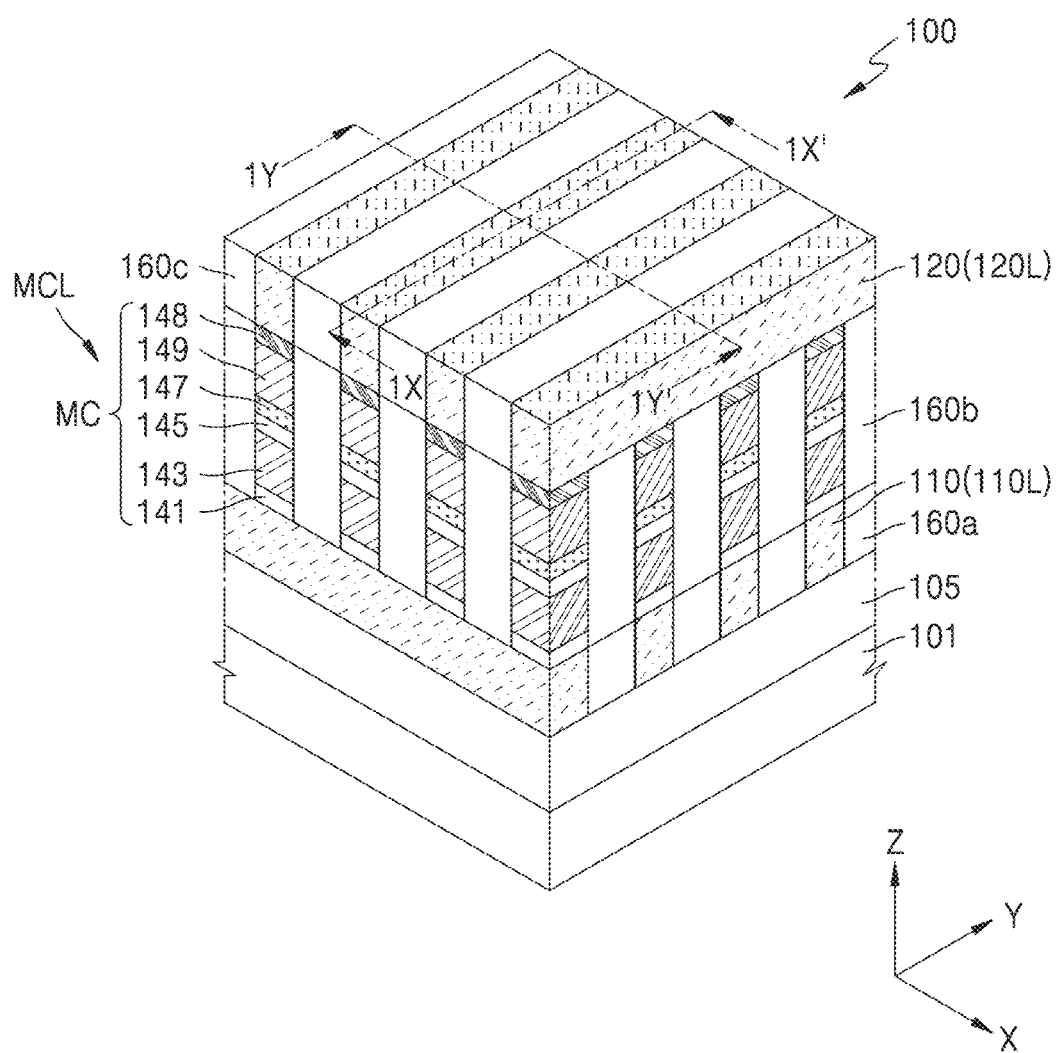
FIG. 3A is a perspective view illustrating a semiconductor apparatus according to an embodiment.
Figure 3B:
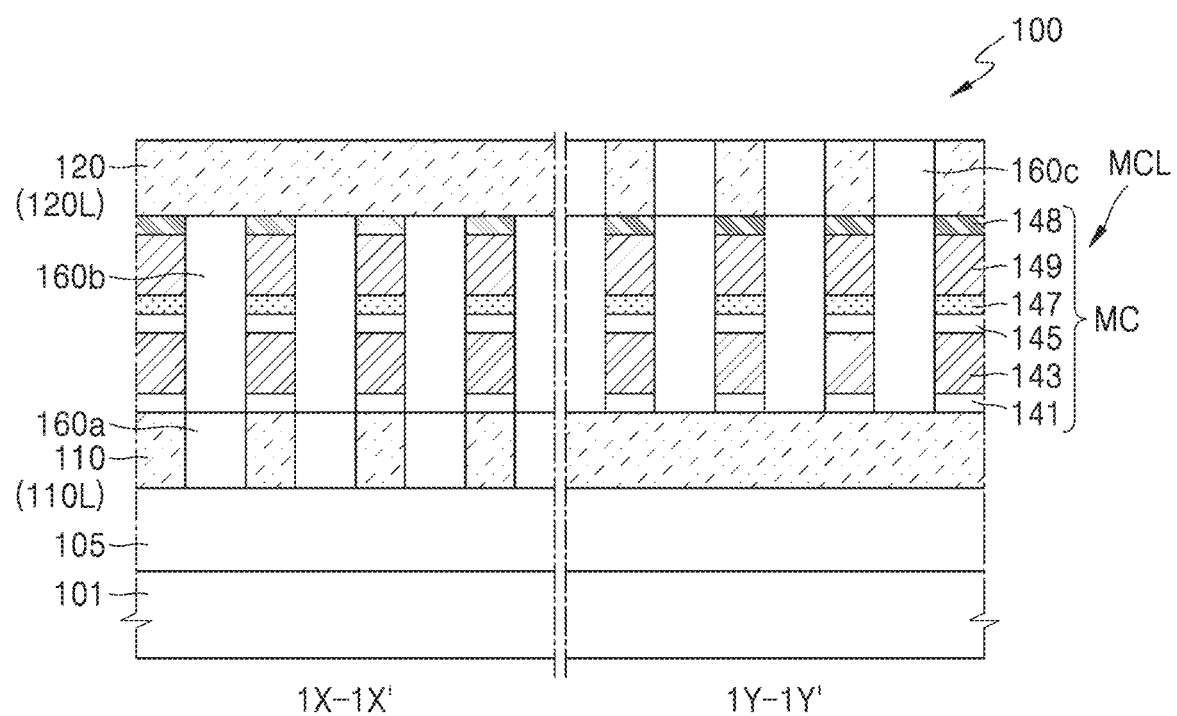
FIG. 3B is a cross-sectional view taken along lines 1X-1X' and 1Y-1Y' of FIG. 3A to illustrate the semiconductor apparatus shown in FIG. 3A.

According to an embodiment, the semiconductor devices MC and the semiconductor apparatus 100 may further include electrodes which electrically connect components to each other. FIGS. 3A and 3B are a perspective view and a cross-sectional view which illustrate a semiconductor apparatus 100 according to an embodiment. Referring to FIGS. 3A and 3B, the semiconductor apparatus 100 may include a first electrode line layer 110L, a second electrode line layer 120L, and a semiconductor device layer MCL which are provided on a substrate 101.

The first electrode line layer 110L may include a plurality of first electrode lines 110 extending parallel to each other in a first direction (X direction). The second electrode line layer 120L may be arranged at a distance from the first electrode line layer 110L and may include a plurality of second electrode lines 120 extending parallel to each other in a second direction (Y direction). The first direction and the second direction may be different from each other and may perpendicularly cross each other like the X and Y directions shown in FIG. 3A, but the first direction and the second direction are not limited thereto. In terms of driving the semiconductor apparatus 100, the first electrode lines 110 may be word lines or bit lines, and the second electrode lines 120 may be bit lines or word lines.

The first electrode lines 110 and the second electrode lines 120 may each independently include a metal, a conductive metal nitride, a conductive metal oxide, or a combination thereof. For example, the first electrode lines 110 and the second electrode lines 120 may each independently include W, WN, Au, Ag, Cu, Al, TiAlN, Ir, Pt, Pd, Ru, Zr, Rh, Ni, Co, Cr, Sn, Zn, ITO, an alloy thereof, or a combination thereof. In addition, the first electrode lines 110 and the second electrode lines 120 may each independently include a metal film and a conductive barrier layer which partially or entirely covers the metal film. The conductive barrier layer may include, for example, Ti, TiN, Ta, TaN, or a combination thereof.

The semiconductor device layer MCL may include a plurality of semiconductor devices MC. The semiconductor devices MC may be separate from each other and may have a three-dimensional structure in which the semiconductor devices MC are arranged at cross points between the first electrode lines 110 and the second electrode lines 120.

The semiconductor devices MC may further include an electrode layer between a selection device layer 143 (SW in FIG. 1) and a variable resistance layer 149 (ME in FIG. 1) to electrically connect the selection device layer 143 and the variable resistance layer 149 to each other. In addition, the semiconductor devices MC may further include an electrode layer between the first electrode lines 110 and the selection device layer 143 and/or between the second electrode lines 120 and the variable resistance layer 149. For example, the selection device layer 143 may be arranged between a first electrode layer 141 and a second electrode layer 145, and the variable resistance layer 149 may be arranged between the second electrode layer 145 and a third electrode layer 148.

The first electrode layer 141, the second electrode layer 145, and the third electrode layer 148 may serve as paths through which current flows, and may include a conductive material. The first electrode layer 141, the second electrode layer 145, and the third electrode layer 148 may each independently include a metal, a conductive metal nitride, a conductive metal oxide, or a combination thereof. For example, the first electrode layer 141, the second electrode layer 145, and the third electrode layer 148 may each independently include one or more selected from the group consisting of carbon (C), titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN).

The selection device layer 143 may be provided as described above.

The variable resistance layer 149 may include a material in which the resistance is variable depending on conditions applied thereto.

According to an embodiment, the variable resistance layer 149 may include a phase change material of which the phase is reversibly changeable according to the temperature thereof. In other words, the variable resistance layer 149 may include a phase change material which is reversibly changeable between crystalline and amorphous phases according to the time of heating (the amount of heat applied thereto). For example, the variable resistance layer 149 may include a phase change material which is reversibly changeable between amorphous and crystalline phases under the influence of Joule heating occurring when an electrical pulse is applied from the outside to the variable resistance layer 149 and thus has variable resistance owing to such a reversible phase change. For example, the phase change material may be in a high resistance state when having an amorphous phase and in a low resistance state when having a crystalline phase. Data may be stored in the variable resistance layer 149 by defining the high resistance state as "0" and the low resistance state as "1."

The phase change material may include selenium (Se) and/or tellurium (Te), and may include one or more elements selected from the group consisting of Ge, Sb, Bi, Pb, Sn, Ag, As, S, Si, In, Ti, Ga, P, B, O, and C. The phase change material may include Ge—Sb—Te (GST). For example, Ge—Sb—Te (GST) may be a compound containing Ge, Sb, and Te and may include $Ge_2Sb_2Te_5$, $Ge_2Sb_2Te_7$, $Ge_1Sb_2Te_4$, and/or $Ge_1Sb_4Te_7$.

The phase change material may further include one or more metal elements selected from the group consisting of aluminum (Al), zinc (Zn), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), and polonium (Po). The metal element may increase the electrical conductivity and thermal conductivity of the variable resistance layer 149 and may increase the crystallization rate of the variable resistance layer 149.

The stoichiometric composition ratio of the elements of the phase change material may be variously selected. According to the stoichiometric composition ratio of the elements of the phase change material, the crystallization temperature, melting point, phase change rate depending on crystallization energy, and information retention ability of the phase change material may be adjusted. For example, the stoichiometric composition of the phase change material may be adjusted such that the melting point of the phase change material may range from about 500° C. to about 800° C.

The variable resistance layer 149 may have a multilayer structure in which a plurality of layers including different materials are alternately stacked. For example, the variable resistance layer 149 may have a structure in which layers including Ge—Te and layers including Sb—Te are alternately stacked. Such a stack structure may be a super-lattice structure. In addition, barrier layers may be further provided between the plurality of layers. The barrier layers may have a function of preventing material diffusion between the plurality of layers.

The semiconductor devices MC may further include a heating electrode layer 147 capable of heating the variable resistance layer 149. The heating electrode layer 147 may be arranged between the second electrode layer 145 and the variable resistance layer 149 and may be in contact with the variable resistance layer 149. The heating electrode layer 147 may include a conductive material which is capable of generating a sufficient amount of heat for causing a phase change in the variable resistance layer 149 without reacting with the variable resistance layer 149. The heating electrode layer 147 may include a carbon-based conductive material. For example, the heating electrode layer 147 may include at least one of TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), silicon carbide (SiC), silicon carbon nitride (SiCN), carbon nitride (CN), titanium carbon nitride (TiCN), tantalum carbon nitride (TaCN), or a combination thereof.

The second electrode layer 145 may have a thickness such that heat generated by the heating electrode layer 147 may not substantially affect the selection device layer 143. The second electrode layer 145 may be thicker than the first electrode layer 141 or the third electrode layer 148 and may have a thickness of about 10 nm to about 100 nm. In addition, the second electrode layer 145 may further include a thermal barrier layer and may have a structure in which thermal barrier layers and electrode material layers are alternately stacked. The heating electrode layer 147 is provided to heat the variable resistance layer 149 including the phase change material of which the phase is changeable by heat, and in the following embodiments in which the variable resistance layer 149 includes a different material, the heating electrode layer 147 may be omitted.

According to another embodiment, the variable resistance layer 149 may include a material in which the resistance is reversibly changeable when in-compound defects are moved by an external voltage applied thereto. For example, the variable resistance layer 149 may include a transition metal oxide. The transition metal oxide may be reversibly changeable between a low resistance state and a high resistance state when electrical paths are formed/destroyed due to the movement of oxygen vacancies caused by an external voltage applied thereto. The transition metal oxide may include one or more metals selected from the group consisting of Ta, Zr, Ti, Hf, Mn, Y, Ni, Co, Zn, Nb, Cu, Fe, and Cr. For example, the transition metal oxide may include one or more selected from the group consisting of $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$ (for example, $0 \leq x \leq 1.5$, $0 \leq y \leq 0.5$).

In another embodiment, the variable resistance layer 149 may include a material in which the electrical resistance is reversibly variable when the polarization state of the material is changed by an external voltage applied thereto. For example, the variable resistance layer 149 may include a perovskite compound. The variable resistance layer 149 may include one or more selected from the group consisting of niobium oxide, titanium oxide, nickel oxide, zirconium oxide, vanadium oxide, PCMO ($(Pr,Ca)MnO_3$), strontium-titanium oxide, barium-strontium-titanium oxide, strontium-zirconium oxide, barium-zirconium oxide, and barium-strontium-zirconium oxide.

In another embodiment, the variable resistance layer 149 may include a material in which the electrical resistance is reversibly variable when the magnetization state of the material is changed by an external voltage applied thereto. The variable resistance layer 149 may have a magnetic tunnel junction (MTJ) structure. For example, the variable resistance layer 149 may include: two electrodes which have magnetic materials; and a dielectric which is arranged between the two magnetic electrodes. The two electrodes including magnetic materials may be a magnetization pinned layer and a magnetization free layer, and the dielectric arranged therebetween may be a tunnel barrier layer. The magnetization pinned layer may have a magnetization direction fixed in one direction, and the magnetization free layer may have a magnetization direction which is changeable by spin torque of internal electrons. For example, the magnetization direction of the magnetization free layer may be reversibly changed so as to be parallel or antiparallel to the magnetization direction of the magnetization pinned layer, and the variable resistance layer 149 may be reversibly changed between a high resistance state and a low resistance state according to the magnetization direction of the magnetization free layer. The magnetized pinned layer and the magnetized free layer may include a ferromagnetic material, and the magnetized pinned layer may further include an antiferromagnetic material which fixes the magnetization direction of an inner ferromagnetic material. In addition, the tunnel barrier layer may include one or more oxides selected from the group consisting of Mg, Ti, Al, MgZn, and MgB.

The semiconductor devices MC may have a pillar shape. For example, the semiconductor devices MC may have a rectangular pillar shape as shown in FIGS. 3A and 3B, or may have various pillar shapes such as a cylindrical pillar shape, an elliptical pillar shape, and a polygonal pillar shape.

In addition, as shown in FIGS. 3A and 3B, the lateral surfaces of the semiconductor devices MC may be perpendicular to the substrate 101, that is, the cross-sectional area of the semiconductor devices MC perpendicular to the stacking direction (Z direction) of the semiconductor devices MC may be constant. However, this is an example, and the semiconductor devices MC may have a structure in which a lower side is wider than an upper side or an upper side is wider than a lower side. In addition, the first electrode layer 141, the second electrode layer 145, the heating electrode layer 147, the third electrode layer 148, the selection device layer 143, and the variable resistance layer 149 may each independently have upper and lower sides of which the areas are equal or different. The shapes of the layers may vary depending on methods of forming the layers. For example, the first electrode layer 141 and the selection device layer 143 may be formed through a damascene process and may thus have a structure in which an upper side is wider than a lower side, and the second electrode layer 145, the heating electrode layer 147, the third electrode layer 148, and the variable resistance layer 149 may be formed through an embossing etching process and may thus have a structure in which lateral surfaces are vertical.

Insulating layers may be further arranged between the first electrode lines 110, between the second electrode lines 120, and/or between the semiconductor devices MC. For example, a first insulating layer 160*a* may be arranged between the first electrode lines 110, a second insulating layer 160*b* may be arranged between the semiconductor devices MC which are spaced apart from each other in the semiconductor device layer MCL, and a third insulating layer 160*c* may be arranged between the second electrode lines 120. The first insulating layer 160*a*, the second insulating layer 160*b*, and/or the third insulating layer 160*c* may each include a dielectric material containing an oxide and/or a nitride and may be formed of the same material or different materials. Alternatively, the first insulating layer 160*a*, the second insulating layer 160*b*, and/or the third insulating layer 160*c* may be air gaps. In this case, an insulating liner (not shown) may be formed between the air gaps and the first electrode lines 110, the second electrode lines 120, or the semiconductor devices MC.

For example, the substrate 101 may include a semiconductor material such as silicon (Si), germanium (Ge), silicon germanium (SiGe), silicon carbide (SiC), gallium arsenic (GaAs), indium arsenic (InAs), indium phosphide (InP), or the like, and may include an insulating material such as silicon oxide, silicon nitride, or silicon oxynitride.

The semiconductor apparatus 100 may further include an interlayer insulating layer 105 on the substrate 101. The interlayer insulating layer 105 may be arranged between the substrate 101 and the first electrode line layer 110L and may electrically separate the substrate 101 and the first electrode line layer 110L from each other. The interlayer insulating layer 105 may include an oxide such as silicon oxide and/or a nitride such as silicon nitride.

Figure 4:
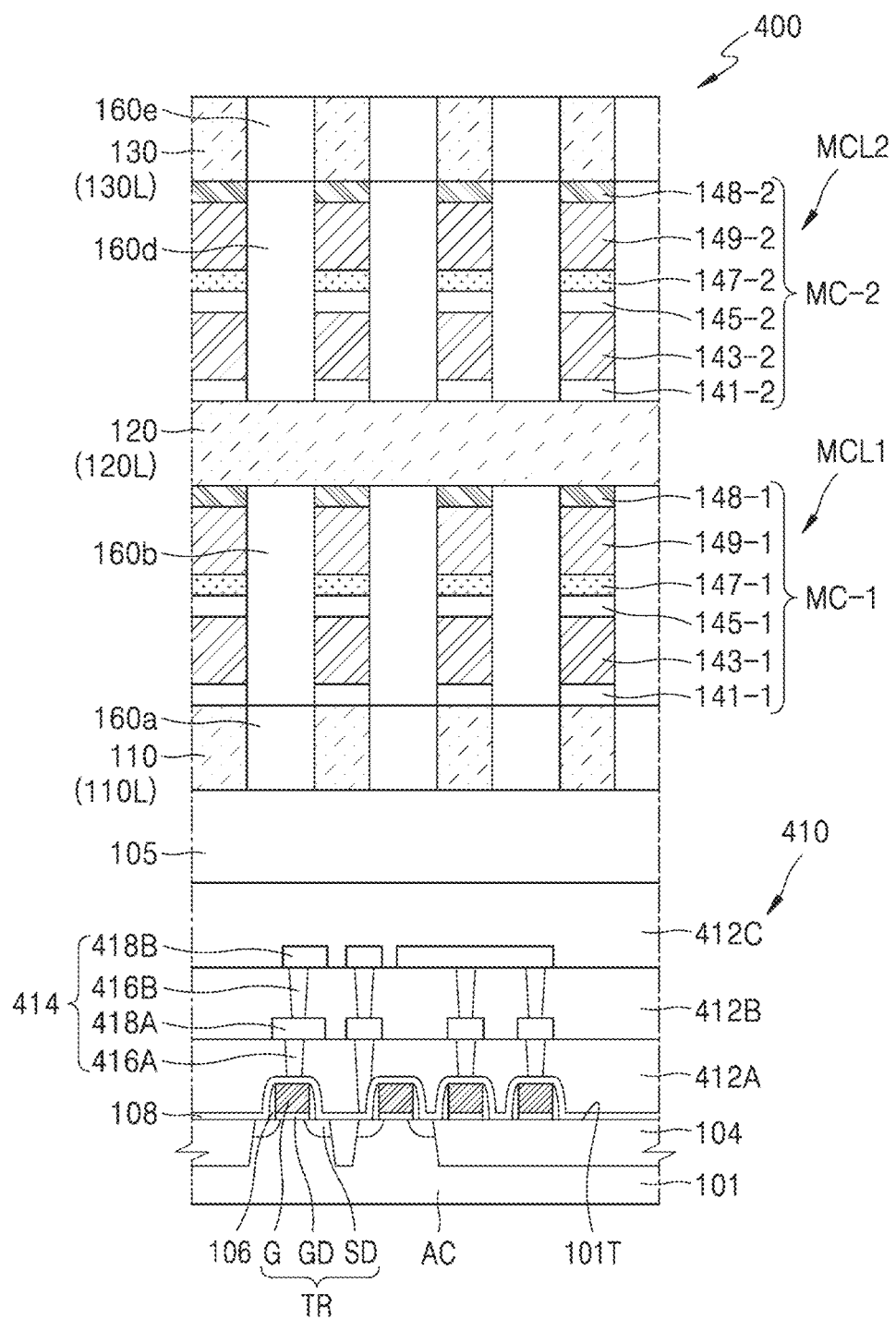
FIG. 4 is a schematic cross-sectional view illustrating a semiconductor apparatus according to another embodiment.

The semiconductor apparatus 100 may include two or more semiconductor device layers MCL. Referring to FIG. 4, a semiconductor apparatus 400 may include a first electrode line layer 110L, a second electrode line layer 120L, a third electrode line layer 130L, a first semiconductor device layer MCL1, and a second semiconductor device layer MCL2 which are provided on a substrate 101. The first semiconductor device layer MCL1 may include a plurality of first semiconductor devices MC-1, and the second semiconductor device layer MCL2 may include a plurality of second semiconductor devices MC-2. The first semiconductor devices MC-1 may include a first electrode layer 141-1, a selection device layer 143-1, a second electrode layer 145-1, a heating electrode layer 147-1, a variable resistance layer 149-1, and a third electrode layer 148-1, and the second semiconductor devices MC-2 may include a first electrode layer 141-2, a selection device layer 143-2, a second electrode layer 145-2, a heating electrode layer 147-2, a variable resistance layer 149-2, and a third electrode layer 148-2. These layers may include the same materials as those included in the above-described first electrode layer 141, the selection device layer 143, the second electrode layer 145, the heating electrode layer 147, the variable resistance layer 149, and the third electrode layer 148. The first semiconductor device layer MCL1 may be arranged between the first electrode line layer 110L and the second electrode line layer 120L, and the second semiconductor device layer MCL2 may be arranged between the second electrode line layer 120L and the third electrode line layer 130L. For example, the first electrode line layer 110L and the third electrode line layer 130L may extend in the same direction (first direction, X direction) and may be apart from each other in a third direction (Z direction). In addition, the second electrode line layer 120L may extend in a second direction (Y direction) and may be arranged between the first electrode line layer 110L and the third electrode line layer 130L at a position away from the first electrode line layer 110L and the third electrode line layer 130L in the third direction (Z direction). The first semiconductor device layer MCL1 may be arranged at cross points between the first electrode line layer 110L and the second electrode line layer 120L, and the second semiconductor device layer MCL2 may be arranged at cross points between the second electrode line layer 120L and the third electrode line layer 130L. In terms of driving the semiconductor apparatus 400, the first electrode line layer 110L and the third electrode line layer 130L may correspond to word lines (or bit lines), and the second electrode line layer 120L may correspond to common bit lines (or common word line).

In FIG. 4, the semiconductor apparatus 400 has two semiconductor device layers MCL1 and MCL2, but the number of semiconductor device layers and the number of electrode line layers may be adjusted according to an intended performance level.

The semiconductor device 400 may further include a driving circuit region 410 on the substrate 101. Referring to FIG. 4, the driving circuit region 410 may include circuit units such as a peripheral circuit, a driving circuit, and a core circuit which drive the first and second semiconductor devices MC-1 and MC-2 or perform arithmetic processes. The circuits may include, for example, a page buffer, a latch circuit, a cache circuit, a column decoder, a sense amplifier, a data in/out circuit or a row decoder. In addition, the circuits may be arranged between the substrate 101 and the first and second semiconductor device layers MCL1 and MCL2. In other words, the driving circuit region 410 and the first and second semiconductor device layers MCL1 and MCL2 may be sequentially arranged on the substrate 101, and this arrangement structure may be a cell-on-peri (COP) structure.

The driving circuit region 410 may include one or more transistors TR and wiring structures 414 which are electrically connected to the transistors TR.

The transistors TR may be arranged in active regions AC of the substrate 101 which are defined by a device isolation layer 104. Each of the transistors TR may include a gate G, a gate insulating layer GD, and a source/drain SD. In addition, insulating spacers 106 may be arranged on both sidewalls of the gate G, and an etch stop layer 108 may be arranged on the gate G and/or the insulating spacers 106. The etch stop layer 108 may include an insulating material such as silicon nitride or silicon oxynitride.

The number and positions of wiring structures 414 may be determined according to the layout of the driving circuit region 410 and the type and arrangement of the gates G. The wiring structures 414 may have a multilayer structure having two or more layers. For example, as shown in FIG. 4, each of the wiring structures 414 may include a first contact 416A, a first wiring layer 418A, a second contact 416B, and a second wiring layer 418B which are electrically connected to each other and are sequentially stacked on the substrate 101. The first contact 416A, the first wiring layer 418A, the second contact 416B, and the second wiring layer 418B may each independently include a metal, a conductive metal nitride, a metal silicide, or a combination thereof, and may include a conductive material such as tungsten, molybdenum, titanium, cobalt, tantalum, nickel, tungsten silicide, titanium silicide, cobalt silicide, tantalum silicide, or nickel silicide.

The wiring structures 414 may include interlayer insulating layers 412A, 412B, and 412C which electrically separate components from each other. Referring to FIG. 4, the interlayer insulating layers 412A, 412B, and 412C may be arranged between the transistors TR, between the first and second wiring layers 418A and 418B, and/or between the first and second contacts 416A and 416B. The interlayer insulating layers 412A, 412B, and 412C may include silicon oxide, silicon nitride, silicon oxynitride, or the like.

The semiconductor device 400 may further include wiring structures (not shown) which electrically connect the first and second semiconductor devices MC-1 and MC-2 to the driving circuit region 410, and the wiring structures (not shown) may be arranged through the interlayer insulating layer 105.

Such a selection device layer as described above may form a switching device together with two electrodes arranged on both sides of the selection device layer. For example, the switching device may be used in various technical fields to control the flow of current according to variations in current and/or voltage. For example, the switching device may be used in place of a P—N diode in a technical field in which P—N diodes are used. Details on the two electrodes and the selection device layer of the switching device may be understood by referring to the above descriptions of the first electrode layer 141, the second electrode layer 145, and the selection device layer 143 which are shown in FIG. 3A.

The ratio $I_{on}/I_{off}$ of on-current to off-current of the selection device layers and/or the switching devices of the embodiments may be about $1.0 \times 10^2$ or more, about $5.0 \times 10^2$ or more, about $1.0 \times 10^3$ or more, about $5.0 \times 10^3$ or more, or about $1.0 \times 10^4$ or more.

In addition, the threshold voltages $V_{th}$ of the switching devices, the semiconductor devices, and/or the semiconductor apparatuses of the embodiments may be about 2.5 V or more, about 2.6 V or more, about 2.7 V or more, about 2.8 V or more, about 2.9 V or more, about 3.0 V or more, about 5.0 or less, about 4.9 V or less, about 4.7 V or less, about 4.6 V or less, or about 4.5 V or less.

The switching devices, the semiconductor devices, and/or the semiconductor apparatuses of the embodiments may have high endurance. For example, the switching devices, the semiconductor devices, and/or the semiconductor devices may have an endurance of about $5.0 \times 10^7$ times or more, about $1.0 \times 10^8$ times or more, about $5.0 \times 10^8$ times or more, about $1.0 \times 10^9$ times or more, about $5.0 \times 10^9$ times or more, or about $1.0 \times 10^{10}$ times or more. The endurance of each device may be defined by the number of on-off operations which are performed, using a pulse having a voltage rise/fall time of about 10 ns and a width of about 100 ns, in a state in which the threshold voltage $V_{th}$ of the device is within the range of an initial threshold voltage (the average of threshold voltage values for 1000 on-off cycles)±15%. In addition, the threshold voltage variation $V_{th\_drift}$ of the switching devices, the semiconductor devices, and/or the semiconductor apparatuses may be about 60 mV/dec or less, about 55 mV/dec or less, or about 50 mV/dec or less.

Figure 5A:
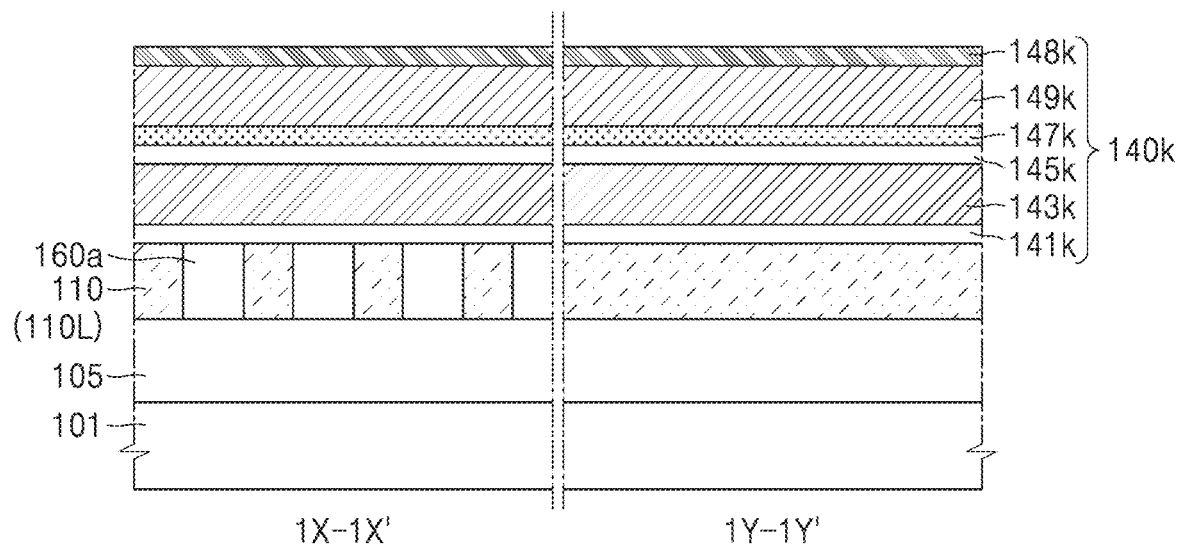
FIGS. 5A to 5C are schematic views illustrating processes for manufacturing a semiconductor apparatus, according to an embodiment.
Figure 5B:
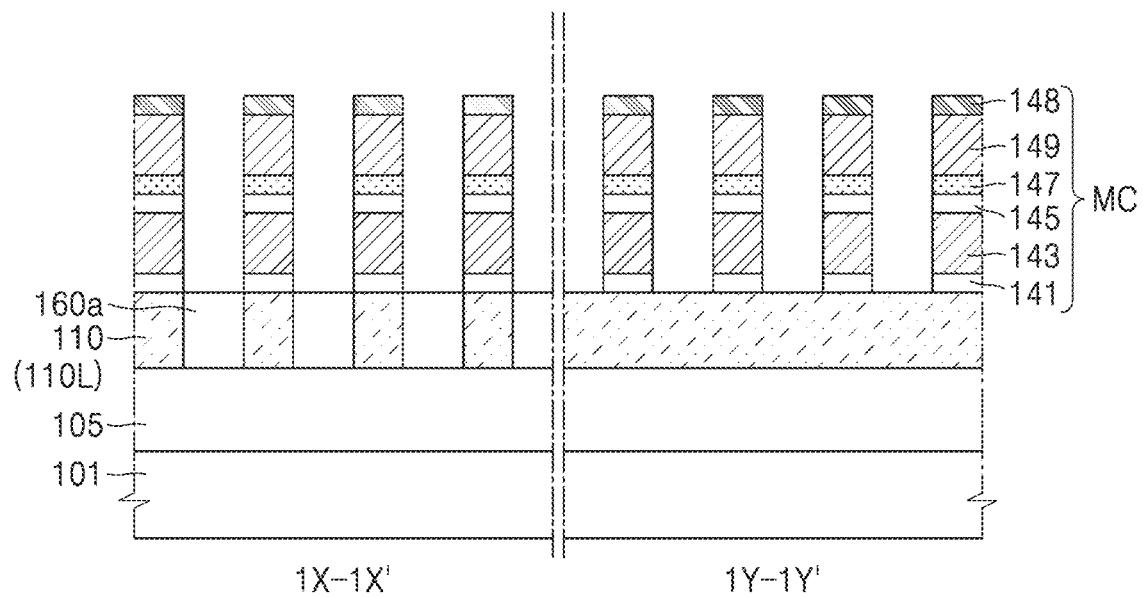
Figure 5C:
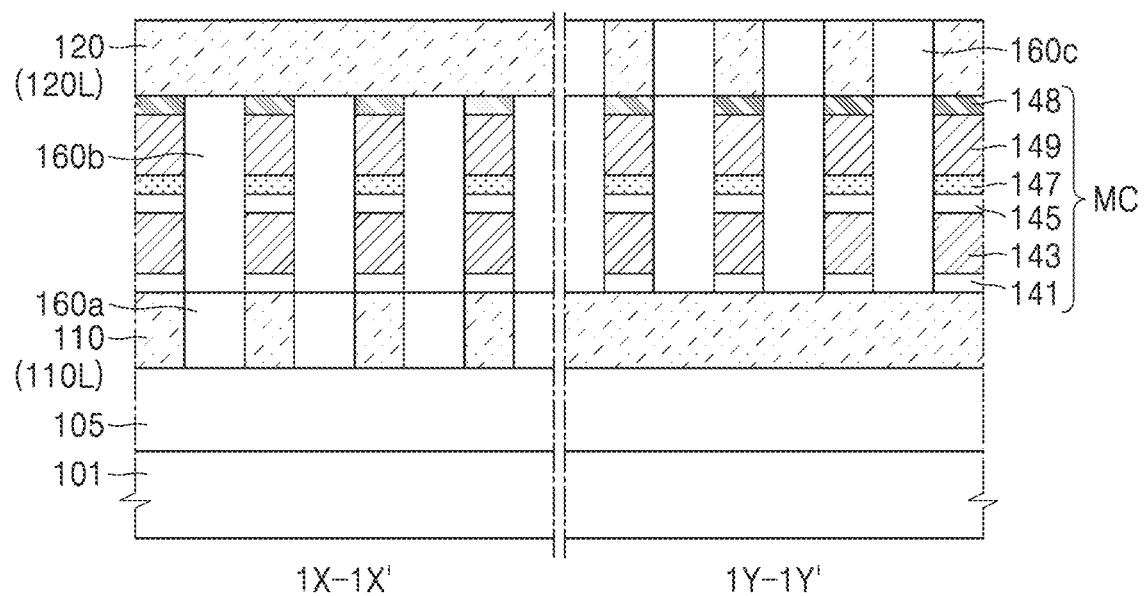

The switching devices, the semiconductor devices, and/or the semiconductor apparatuses may be manufactured by general methods which are known in the art. FIGS. 5A to 5C are cross-sectional views illustrating processes of manufacturing semiconductor devices according to an embodiment.

Referring to FIG. 5A, an interlayer insulating layer 105 is formed on a substrate 101. A first electrode line layer 110L including a plurality of first electrode lines 110, which extend in a first direction (X direction) and are apart from each other, is formed on the interlayer insulating layer 105. The first electrode line layer 110L may be formed by forming a conductive layer for first electrode lines 110 and then patterning the conductive layer by etching. A first insulating layer 160a may be filled between the first electrode lines 110. The first insulating layer 160a may be formed by filling gaps between the first electrode lines 110 with an insulating material and leveling the insulating material through a chemical mechanical polishing (CMP) process until the top surfaces of the first electrode lines 110 are exposed. A first electrode material layer 141k, a selection device material layer 143k, a second electrode material layer 145k, a heating electrode material layer 147k, a variable resistance material layer 149k, and a third electrode material layer 148k are sequentially stacked on the first electrode line layer 110L and the first insulating layer 160a to form a stack structure 140k.

Referring to FIG. 5B, mask patterns (not shown) spaced apart from each other in the first direction (X direction) and a second direction (Y direction) are formed on the stack structure 140k, and the stack structure 140k is etched using the mask patterns until portions of the top surfaces of the first insulating layer 160a and the first electrode lines 110 are exposed. A plurality of semiconductor devices MC spaced apart from each other in the first direction and the second direction may be formed according to the structure of the mask patterns. The plurality of semiconductor devices MC may each include a first electrode layer 141, a selection device layer 143, a second electrode layer 145, a heating electrode layer 147, a variable resistance layer 149, and a third electrode layer 148, and may be electrically connected to the first electrode lines 110. In addition, the mask patterns may be removed through an ashing and stripping process.

Referring to FIG. 5C, a second insulating layer 160b may be filled between the semiconductor devices MC. A second electrode line layer 120L including a plurality of second electrode lines 120, which extend in the second direction (X direction) and are apart from each other, is formed on the semiconductor devices MC and the second insulating layer 160b. A third insulating layer 160c may be filled between the second electrode lines 120.

Components such as the first and second electrode lines 110 and 120, the first, second and third electrode layers 141, 145 and 148, the heating electrode layer 147, the insulating layers 105, 160a, 160b, 160c, the selection device layer 143, and the variable resistance layer 149 may be formed by methods known in the art. Each of the components may be independently formed to have a desired composition and thickness through a deposition method such as atomic layer deposition (ALD), chemical vapor deposition (CVD), physical vapor deposition (PVD), or sputtering. For example, the selection device material layer 143k may be formed by a PVD or sputtering method using a source or target including indium (In), germanium (Ge), arsenic (As), selenium (Se), and tellurium (Te).

In addition, the components may be independently patterned by methods known in the art. For example, in addition to the above-described patterning method, a damascene method may also be used. For example, when the second electrode lines 120 are formed through a damascene process, a thick insulating material layer is formed between and on the semiconductor devices MC, and then the insulating material layer is etched to form trenches. The trenches may extend in the second direction and may expose the top surface of the variable resistance layer 149. The second electrode lines 120 may be formed by filling the trenches with a conductive material and leveling the conductive material. The second insulating layer 160b and the third insulating layer 160c may be of a one body type.

Figure 6A:
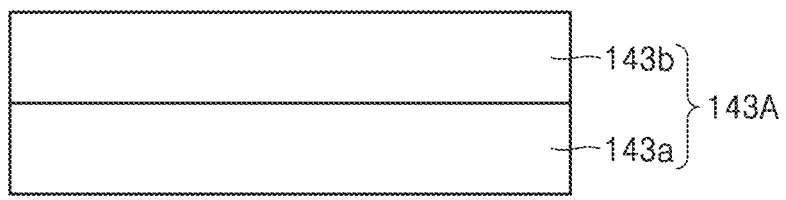
FIGS. 6A through 6C illustrate selection layers according to some example embodiments.
Figure 6B:
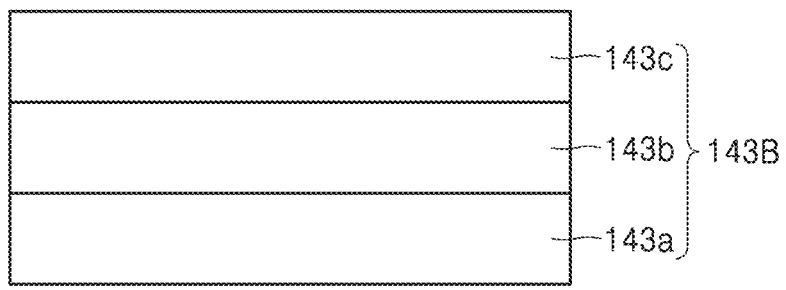
Figure 6C:
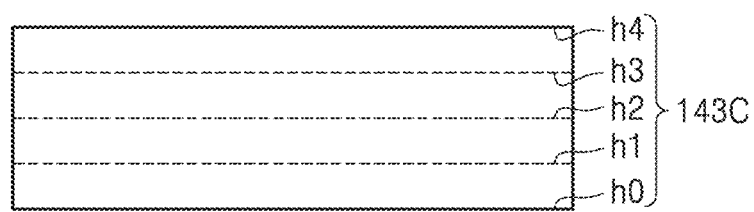
Figure 6D:
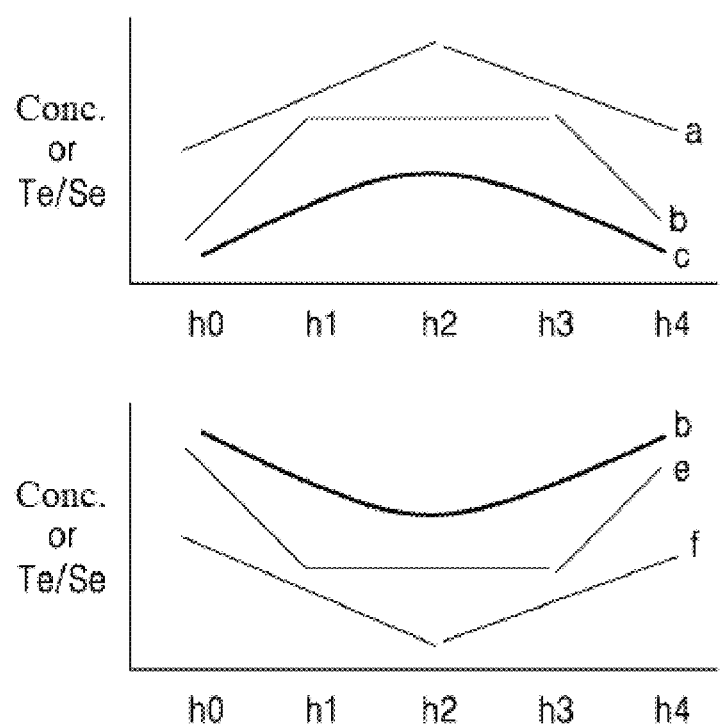
FIG. 6D is a graph illustrating a concentration or Te/Se ratio profile of the selection layer in FIG. 6C.

FIGS. 6A through 6C illustrate selection layers according to some example embodiments. FIG. 6D is a graph illustrating a concentration or Te/Se ratio profile of the selection layer in FIG. 6C.

Referring to FIGS. 6A to 6B, selection layers 143A and 143B may include a plurality of sublayers. In FIGS. 6A and 6B, each selection layer 143A and 143B may include two or more sublayers with different compositions. The selection layer 143A in FIG. 6A includes a first sublayer 143a and a second sublayer 143b on the first sublayer 143a. The selection layer 143B in FIG. 6B may be the same as the selection layer 143A in FIG. 6A, but also may further include a third sublayer 143c on the second sublayer 143b.

The sublayers 143a, 143b and 143c may be different from each other in terms of chemical composition and/or ratio. For example, the sublayers 143a, 143b and 143c may include chalcogen compounds represented by the same or different Chemical Expressions among Chemical Expressions 1, 2, 3, 4, 5, and 6 discussed above. For example, the sublayers 143a, 143b, and 143c independently may have a different first element A (or A' for Chemical Expression 4), second element B, or third element C from each other. The sublayers 143a, 143b, and 143c in FIGS. 6A and 6B also may have different values for the stoichiometric coefficients in Chemical Expressions 1 to 3.

In an embodiment, as shown in FIG. 6C, The selection layer 143C in FIG. 6C may have a varied concentration at different thicknesses h0 to h4. Referring to FIGS. 6C and 6D, the concentration of an element (A, A', B, or C in Chemical Expressions 1-6) or the Te/Se ratio in the selection layer 143C may vary based on the thickness h0 to h4. FIG. 6D illustrates curves a-c and d-f for the element concentration or T/Se ratio profile.

The selection layers 143A to 143C in FIGS. 6A to 6C may be substituted for the selection layers 143, 143-1, 143-2, 143k in FIGS. 3A, 3B, 4, and 5A to 5C of the present application.

Figure 7:
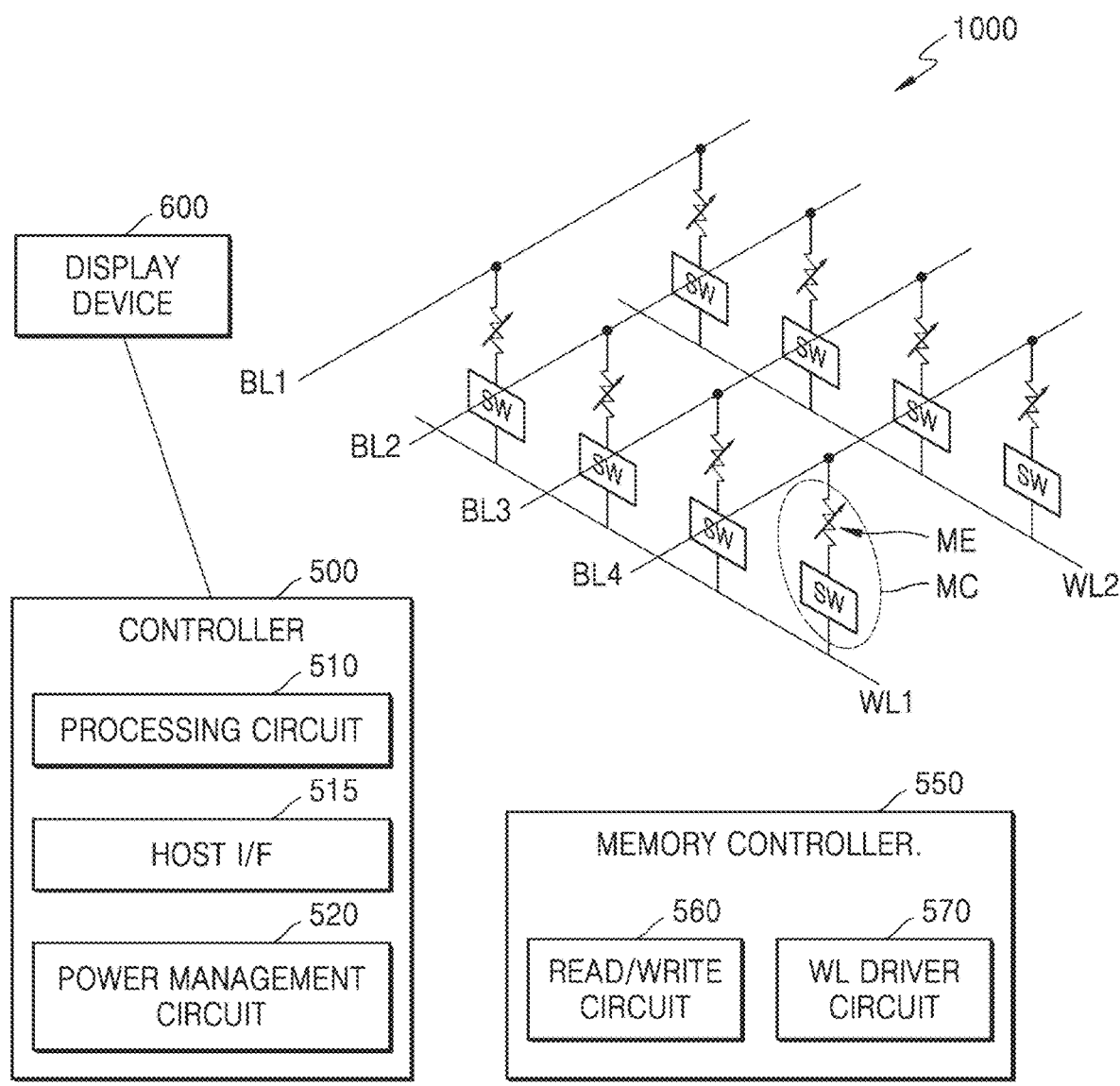
FIG. 7 is a diagram of an electronic device including a semiconductor apparatus according to an example embodiment.

FIG. 7 is a diagram of an electronic device including a semiconductor apparatus according to an example embodiment.

Referring to FIG. 7, an electronic device 1000 may include a controller 500, memory controller 550, display device 600 (e.g., OLED display, holographic display), and semiconductor apparatus 100. The memory controller 550 may include a read/write circuit 560 and a word line driver circuit 570. The read/write circuit 560 and word line driver circuit 570 may be electrically connected to the semiconductor apparatus 100 through first electrode lines (e.g., WL1) and second electrode lines (e.g., BL1). The controller 500 may control operations of the electronic device 1000 and may include processing circuitry 510, a host interface 515, and a power management circuit 520. The semiconductor apparatus 100 may be implemented using one of the semiconductor apparatuses 100 and 400 described above. In the electronic device 1000, the semiconductor apparatus 100 may be implanted using any of the selection layers 143, 143-1, 143-2, 143k, and 143A to 143C described above in FIGS. 3A, 3B, 4, 5A to 5C, and 6A to 6C of the present application.

When the controller 500 receives commands from an external host (not shown) through the host interface 515, the processing circuitry 510 may operate in response to those commands and may control operations of the display device 600, memory controller 550, and/or semiconductor apparatus 100. The controller 500 may control the display device 600 by providing commands and information to the display device 600 and by controlling power to the display device 600 using the power management circuit 520. The controller 500 may control power provided to the memory controller 550 and semiconductor apparatus 100 using the power management circuit 520. The controller 500 may control operations of the semiconductor apparatus 100 by providing commands to the memory controller 550. The controller 500 may also provide the memory controller 550 with data to be written in the semiconductor apparatus 100 and/or may receive data read from the semiconductor apparatus 100. The memory controller 550, in response to receiving commands from the controller 500 and/or in response to receiving data for a write operation, may control the semiconductor apparatus 100 using the read/write circuit 560 and word line driver circuit 570 to write data, read data, and/or erase data in one or more selected semiconductor unit devices MC of the semiconductor apparatus 100. The memory controller 550, in response to receiving commands from the controller 500, may read data from the semiconductor apparatus 100 and provide the data read from the semiconductor apparatus 100 to the controller 500.

One or more of the elements discussed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Hereinafter, the semiconductor devices will be described through examples. However, the following examples are for illustrative purposes only and do not limit the scope of the present disclosure.

Examples 1 to 4

A first electrode layer was formed by a DC sputtering method or an ALD method.

A chalcogen compound layer was formed on the first electrode layer by sputtering. Specifically, the chalcogen compound layer was formed to a thickness of 15 nm to 20 nm by using a target containing indium (In), germanium (Ge), arsenic (As), selenium (Se), and tellurium (Te). The composition of the target was adjusted such that the chalcogen compound layer had an indium (In) content of 0.1 at % to 10 at %, a germanium (Ge) content of 5 at % to 30 at %, an arsenic (As) content of 20 at % to 50 at %, a selenium (Se) content of 20 at % to 70 at %, and tellurium (Te) content of 3 at % to 12 at %, and the ratio of tellurium (Te) to selenium (Se) in the chalcogen compound layer was as shown in Table 1.

The concentrations of In, Ge, and As are the same for Examples 1 to 4.

A second electrode layer was formed on the chalcogen compound layer by a DC sputtering method or an ALD method.

Comparative Example 1

A semiconductor device was fabricated in the same manner as in Example 1 except that a chalcogen compound layer was formed using a precursor containing germanium (Ge), arsenic (As), and selenium (Se) but not containing indium (In) and tellurium (Te).

Comparative Example 2

A semiconductor device was fabricated in the same manner as in Example 1 except that a chalcogen compound layer was formed using a precursor containing indium (In), germanium (Ge), arsenic (As), and selenium (Se) but not containing tellurium (Te).

Electrical Property Evaluation 1

The threshold voltage $V_{th}$, the off-current $I_{off}$, the threshold voltage variation $V_{th\_drift}$, and the endurance of each of the semiconductor devices of Examples 1 to 4, Comparative Example 1, and Comparative Example 2 were measured, and the measured values were normalized based on the measured values of Comparative Example 1 as shown in Table 1.

Referring to Table 1, the semiconductor devices of Examples 1 to 4 have low off-current ($I_{off}$) values and high threshold voltage ($V_{th}$) values, which are similar to those of the semiconductor devices of Comparative Example 1 and/or Comparative Example 2, and have threshold voltage variation $V_{th\_drift}$ and endurance, which are improved compared to those of the semiconductor devices of Comparative Example 1 and Comparative Example 2. Furthermore, in the semiconductor devices of Examples 1 to 4, threshold voltage variation $V_{th\_drift}$ and endurance are improved as the element ratio of tellurium (Te) to selenium (Se) increases, and threshold voltage $V_{th}$ increases and off-current $I_{off}$ decreases as the element ratio of tellurium (Te) to selenium (Se) decreases.

As shown in Table 1, referring to Examples 1 to 4, increasing the Te/Se ratio lowers the Normalized threshold voltage variation $V_{th\_drift}$ and increases the normalized endurance, but increasing the Te/Se ratio in Examples 1 to 4 also increases the normalized off current $I_{off}$. However, in Examples 1 to 4, the normalized off-current ($I_{off}$) remains less than or equal to 15 nA, which may be suitable for many device applications.

TABLE 1

| | Element ratio | | Normalized threshold voltage | Normalized off-current | Normalized threshold voltage variation ($V_{th\_drift}$) | Normalized (Endurance) (number of |
|---|---|---|---|---|---|---|
| | Te(at %) | Te/Se | ($V_{th}$) (V) | ($I_{off}$) (nA) | (mV/dec) | times) |
| Example 1 | 3.0 | 0.06 | 0.78 | 5.08 | 0.65 | 10 |
| Example 2 | 6.0 | 0.13 | 0.7 | 4.74 | 0.58 | 50 |
| Example 3 | 9.0 | 0.19 | 0.67 | 10.54 | 0.58 | 50 |
| Example 4 | 12.0 | 0.27 | 0.63 | 11.54 | 0.51 | 1000 |
| Comparative Example 1 | 0.0 | — | 1 | 1 | 1 | 1 |
| Comparative Example 2 | 0.0 | — | 0.9 | 3 | 0.69 | 5 |

The chalcogen compounds may have ovonic threshold switching characteristics.

The switching devices, the semiconductor devices, and/or the semiconductor apparatuses may have low off-current values (low leakage current) and high endurance. These devices and/or apparatuses may improve the degree of integration and may contribute to miniaturization of electronic devices.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A semiconductor device comprising:
   a selection layer including a chalcogen compound, wherein
   the chalcogen compound includes a first element, a second element, a third element, selenium (Se), and tellurium (Te),
   the first element includes at least one of indium (In), aluminum (Al), strontium (Sr), and calcium (Ca),
   the second element includes at least one of germanium (Ge) and tin (Sn), and
   the third element includes at least one of arsenic (As), antimony (Sb), and bismuth (Bi).

2. The semiconductor device of claim 1, wherein, in the chalcogen compound, an element ratio of tellurium (Te) to selenium (Se) is greater than 0.0 but equal to or less than 0.5.

3. The semiconductor device of claim 1, wherein, in the chalcogen compound, an element ratio of tellurium (Te) to selenium (Se) is greater than 0.0 and equal to or less than 0.2.

4. The semiconductor device of claim 1, wherein, in the chalcogen compound, an element ratio of tellurium (Te) to selenium (Se) ranges from 0.07 to 0.20.

5. The semiconductor device of claim 1, wherein, in the chalcogen compound, tellurium (Te) is included in an amount of 0.5 at % to 20.0 at % based on a total element amount.

6. The semiconductor device of claim 1, wherein, in the chalcogen compound, tellurium (Te) is included in an amount of 2.0 at % to 15.0 at % based on a total element amount.

7. The semiconductor device of claim 1, wherein, in the chalcogen compound,
   tellurium (Te) is included in an amount of about 3 at % to 9 at % based on a total element amount, and
   an element ratio of tellurium (Te) to selenium (Se) is greater than or equal to about 0.06 and less than or equal to about 0.19.

8. The semiconductor device of claim 1, wherein, in the chalcogen compound, selenium (Se) is included in an amount of greater than 0.0 at % and equal to or less than 70.0 at % based on a total element amount.

9. The semiconductor device of claim 1, wherein, in the chalcogen compound, selenium (Se) is included in an amount of 20.0 at % to 70.0 at % based on a total element amount.

10. The semiconductor device of claim 1, wherein, in the chalcogen compound, the first element is included in an amount of 0.1 at % to 10.0 at % based on a total element amount.

11. The semiconductor device of claim 1, wherein, in the chalcogen compound, the second element is included in an amount of 5.0 at % to 30.0 at % based on a total element amount.

12. The semiconductor device of claim 1, wherein, in the chalcogen compound, the third element is included in an amount of 5.0 at % to 50.0 at % based on a total element amount.

13. The semiconductor device of claim 1, wherein, in the chalcogen compound, the third element is included in an amount of 20.0 at % to 50.0 at % based on a total element amount.

14. The semiconductor device of claim 1, wherein the chalcogen compound is represented by any one of Chemical Expressions 1, 2, or 3 below:

$$A_{a1}B_{b1}C_{c1}Se_{d1}Te_{e1}$$ [Chemical Expression 1]

wherein, in Chemical Expression 1, A refers to the first element, B refers to the second element, C refers to the third element, and 0.01≤a1≤0.10, 0.05≤b1≤0.30, 0.05≤c1≤0.50, 0.20≤d1≤0.70, and 0.0<e1≤0.1;

$$A_{a2}B_{b2}C_{c2}Se_{d2}Te_{e2}$$ [Chemical Expression 2]

wherein, in Chemical Expression 2, A refers to the first element, B refers to the second element, C refers to the third element, and 0.01≤a2≤0.10, 0.05≤b2≤0.30, 0.05≤c2≤0.50, 0.20≤d2≤0.70, and 0.05≤e2≤0.2; and $$A_{a3}B_{b3}C_{c3}Se_{d3}Te_{e3}$$ [Chemical Expression 3]

wherein, in Chemical Expression 3, A refers to the first element, B refers to the second element, C refers to the third element, and 0.001≤a3≤0.10, 0.05≤b3≤0.30, 0.20≤c3≤0.50, 0.20≤d3≤0.70, and 0<e3≤0.2.

15. The semiconductor device of claim 1, wherein the chalcogen compound further comprises at least one of carbon (C), nitrogen (N), and oxygen (O).

16. The semiconductor device of claim 1, wherein the chalcogen compound has a crystallization temperature of 350° C. to 600° C.

17. The semiconductor device of claim 1, wherein the chalcogen compound has a sublimation temperature of 250° C. to 400° C.

18. The semiconductor device of claim 1, comprising: a variable resistance layer, wherein
the selection layer is electrically connected to the variable resistance layer.

19. The semiconductor device of claim 18, further comprising:
a first electrode layer;
a second electrode layer; and
a third electrode layer, wherein
the selection layer is arranged between the first electrode layer and the second electrode layer, and
the variable resistance layer is arranged between the second electrode layer and the third electrode layer.

20. The semiconductor device of claim 19, wherein each of the first electrode layer, the second electrode layer, and the third electrode layer independently comprises at least one of carbon (C), titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN).

21. The semiconductor device of claim 18, wherein the variable resistive layer comprises a material capable of reversibly changing between crystalline and amorphous phases according to temperature variations.

22. The semiconductor device of claim 21, wherein
the variable resistance layer comprises a compound containing at least one of Te and Se, and further containing at least one of Ge, Sb, Bi, Pb, Sn, Ag, As, S, Si, In, Ti, Ga, P, B, O, and C.

23. The semiconductor device of claim 22, wherein
the variable resistance layer further comprises at least one of aluminum (Al), zinc (Zn), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), and polonium (Po).

24. The semiconductor device of claim 21, further comprising:
a heating electrode layer in contact with the variable resistance layer.

25. The semiconductor device of claim 18, wherein the variable resistance layer comprises a material in which electrical resistance is reversibly variable according to an external voltage applied thereto.

26. The semiconductor device of claim 24, wherein the variable resistance layer comprises an oxide of at least one of Ta, Zr, Ti, Hf, Mn, Y, Ni, Co, Zn, Nb, Cu, Fe, and Cr.

27. The semiconductor device of claim 18, wherein the variable resistance layer comprises a material in which polarization is reversibly changeable according to an external voltage applied thereto.

28. The semiconductor device of claim 27, wherein
the variable resistance layer comprises at least one perovskite compound including one of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, and barium-strontium-zirconium oxide.

29. The semiconductor device of claim 18, wherein the variable resistance layer comprises a material in which magnetization is reversibly variable according to an external voltage applied thereto.

30. The semiconductor device of claim 29, wherein the variable resistance layer comprises:
two electrodes comprising a magnetic material; and
a dielectric arranged between the two electrodes.

31. The semiconductor device of claim 18, wherein the selection layer has a threshold voltage of 2.5 V to 5.0 V.

32. The semiconductor device of claim 18, wherein the selection layer is capable of repeatedly performing an on-off operation 5×10$^7$ times or more by using a pulse having a rise/fall time of 10 ns and a width of 100 ns.

33. The semiconductor device of claim 18, wherein the selection layer has a threshold voltage variation Vt$_h$_drift of 50 mV/dec or less.

34. A semiconductor apparatus comprising:
a substrate;
a plurality of first electrode lines on the substrate, the plurality of first electrode lines extending parallel to a top surface of the substrate and extending in a first direction;

a plurality of second electrode lines above the plurality of first electrode lines and parallel to the top surface of the substrate, the plurality of second electrode lines extending in a second direction different from the first direction; and a first semiconductor device including the semiconductor device of claim 1, wherein the first semiconductor device is arranged at a cross point between the plurality of first electrode lines and the plurality of second electrode lines.

35. The semiconductor apparatus of claim 34, further comprising:

a plurality of third electrode lines above the plurality of first electrode lines and the plurality of second electrode lines, the plurality of third electrode lines extending in the first direction; and a second semiconductor device like the first semiconductor device, the second semiconductor device being arranged at a cross point between the plurality of second electrode lines and the plurality of third electrode lines.

36. The semiconductor apparatus of claim 35, further comprising:

a circuit unit configured to drive the first semiconductor device and the second semiconductor device or perform arithmetic processing.

37. A chalcogen compound comprising:

a first element comprising at least one of indium (In), aluminum (Al), strontium (Sr), and calcium (Ca);

a second element comprising at least one of germanium (Ge) and tin (Sn);

a third element comprising at least one of arsenic (As), antimony (Sb), and bismuth (Bi); and a chalcogen element, wherein the chalcogen element comprises selenium (Se) and tellurium (Te) with an element ratio of tellurium (Te) to selenium (Se) being within a range of greater than 0.0 and equal to or less than 0.5.

38. The chalcogen compound of claim 37, wherein an element ratio of tellurium (Te) to selenium (Se) is greater than 0.0 and equal to or less than 0.3.

39. The chalcogen compound of claim 37, wherein an element ratio of tellurium (Te) to selenium (Se) is greater than 0.07 and equal to or less than about 0.20.

40. The chalcogen compound of claim 37, wherein tellurium (Te) is included in an amount of 2.0 at % to 15.0 at % based on a total element amount.

41. The chalcogen compound of claim 37, wherein tellurium (Te) is included in an amount of about 3 at % to 9 at % based on a total element amount, and an element ratio of tellurium (Te) to selenium (Se) is greater than or equal to about 0.06 and less than or equal to about 0.19.

42. The chalcogen compound of claim 37, wherein selenium (Se) is included in an amount of 20.0 at % to 70.0 at % based on a total element amount.

43. The chalcogen compound of claim 37, wherein the first element is included in an amount of 0.1 at % to 10.0 at % based on a total element amount.

44. The chalcogen compound of claim 37, wherein the second element is included in an amount of 5.0 at % to 30.0 at % based on a total element amount.

45. The chalcogen compound of claim 37, wherein the third element is included in an amount of 20.0 at % to 50.0 at % based on a total element amount.

46. The chalcogen compound of claim 37, wherein the chalcogen compound is represented by any one of Chemical Expressions 1, 2, or 3 below:

$$A_{a1}B_{b1}C_{c1}Se_{d1}Te_{e1} \qquad \text{[Chemical Expression 1]}$$

wherein, in Chemical Expression 1, A refers to the first element, B refers to the second element, C refers to the third element, and $0.01 \leq a1 \leq 0.10$, $0.05 \leq b1 \leq 0.30$, $0.05 \leq c1 \leq 0.50$, $0.20 \leq d1 \leq 0.70$, and $0.0 < e1 \leq 0.1$;

$$A_{a2}B_{b2}C_{c2}Se_{d2}Te_{e2} \qquad \text{[Chemical Expression 2]}$$

wherein, in Chemical Expression 2, A refers to the first element, B refers to the second element, C refers to the third element, and $0.01 \leq a2 \leq 0.10$, $0.05 \leq b2 \leq 0.30$, $0.05 \leq c2 \leq 0.50$, $0.20 \leq d2 \leq 0.70$, and $0.05 \leq e2 \leq 0.2$; and $$A_{a3}B_{b3}C_{c3}Se_{d3}Te_{e3} \qquad \text{[Chemical Expression 3]}$$

wherein, in Chemical Expression 3, A refers to the first element, B refers to the second element, C refers to the third element, and $0.001 \leq a3 \leq 0.10$, $0.05 \leq b3 \leq 0.30$, $0.20 \leq c3 \leq 0.50$, $0.20 \leq d3 \leq 0.70$, and $0 < e3 \leq fr3.2$.

* * * * *